(12) United States Patent
Hiremath et al.

(10) Patent No.: US 10,692,808 B2
(45) Date of Patent: Jun. 23, 2020

(54) HIGH PERFORMANCE CELL DESIGN IN A TECHNOLOGY WITH HIGH DENSITY METAL ROUTING

(71) Applicant: QUALCOMM Incorporated, San Diego, CA (US)

(72) Inventors: Renukprasad Hiremath, San Diego, CA (US); Hyeokjin Lim, San Diego, CA (US); Foua Vang, Anaheim, CA (US); Xiangdong Chen, San Diego, CA (US); Venugopal Boynapalli, San Marcos, CA (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 15/707,807

(22) Filed: Sep. 18, 2017

(65) Prior Publication Data
US 2019/0088591 A1   Mar. 21, 2019

(51) Int. Cl.
*H01L 23/522* (2006.01)
*H01L 27/02* (2006.01)
*H01L 23/528* (2006.01)
*H01L 27/092* (2006.01)

(52) U.S. Cl.
CPC ........ *H01L 23/5223* (2013.01); *H01L 23/528* (2013.01); *H01L 27/0207* (2013.01); *H01L 27/092* (2013.01)

(58) Field of Classification Search
CPC . H01L 27/092–0928; H01L 2924/0002; H01L 27/0207; H01L 23/5286; H01L 29/78; H01L 23/5223; H01L 23/528; H01L 23/5221–5225; H01L 23/525–5258; H01L 23/535; G11C 5/02–10

USPC .......................................................... 257/369
See application file for complete search history.

(56) References Cited

U.S. PATENT DOCUMENTS

| | | | |
|---|---|---|---|
| 4,570,176 A | 2/1986 | Kolwicz et al. |
| 4,609,931 A | 9/1986 | Koike |
| 4,851,892 A | 7/1989 | Anderson et al. |
| 5,082,796 A | 1/1992 | El-Diwany et al. |
| 5,360,757 A | 11/1994 | Lage |
| 5,376,585 A | 12/1994 | Lin et al. |

(Continued)

FOREIGN PATENT DOCUMENTS

| | | |
|---|---|---|
| CN | 101521206 A | 9/2009 |
| CN | 102104041 A | 6/2011 |

(Continued)

OTHER PUBLICATIONS

International Search Report and Written Opinion—PCT/US2018/048076—ISA/EPO—dated Nov. 28, 2018.

(Continued)

*Primary Examiner* — Nelson Garces
(74) *Attorney, Agent, or Firm* — Loza & Loza, LLP/Qualcomm (57) ABSTRACT

In certain aspects, a semiconductor die includes a first doped region, a second doped region, and an interconnect formed from a first middle of line (MOL) layer, wherein the interconnect electrically couples the first doped region to the second doped region. The semiconductor die also includes a first metal line formed from a first interconnect metal layer, and a first via electrically coupling the interconnect to the first metal line.

13 Claims, 10 Drawing Sheets

(56) References Cited

U.S. PATENT DOCUMENTS

| | | |
|---|---|---|
| 5,449,940 A | 9/1995 | Hirata |
| 5,883,846 A | 3/1999 | Lee |
| 5,905,287 A | 5/1999 | Hirata |
| 6,147,857 A | 11/2000 | Worley et al. |
| 6,388,296 B1 | 5/2002 | Hsu |
| 6,441,469 B1 | 8/2002 | Chrysostomides et al. |
| 6,469,354 B1 | 10/2002 | Hirata |
| 6,475,851 B1 | 11/2002 | Casper et al. |
| 6,534,805 B1 | 3/2003 | Jin |
| 6,536,028 B1 | 3/2003 | Katsioulas et al. |
| 6,683,351 B2 | 1/2004 | Morita et al. |
| 6,767,827 B1 | 7/2004 | Okada et al. |
| 6,818,547 B2 | 11/2004 | Chen et al. |
| 6,969,952 B2 | 11/2005 | Gedamu et al. |
| 7,119,413 B2 | 10/2006 | Kutsukake et al. |
| 7,335,583 B2 | 2/2008 | Chang |
| 7,446,352 B2 | 11/2008 | Becker et al. |
| 7,476,920 B2 | 1/2009 | Schloesser |
| 7,510,960 B2 | 3/2009 | Toomey |
| 7,678,658 B2 | 3/2010 | Yang et al. |
| 7,681,164 B2 | 3/2010 | Lin et al. |
| 7,763,534 B2 | 7/2010 | Smayling et al. |
| 7,791,109 B2 | 9/2010 | Wann et al. |
| 7,808,017 B2 | 10/2010 | Hamada |
| 7,813,616 B2 | 10/2010 | Shimizu |
| 7,851,833 B2 | 12/2010 | Abe et al. |
| 7,919,792 B2 | 4/2011 | Law et al. |
| 7,920,403 B2 | 4/2011 | Liaw |
| 8,026,536 B2 | 9/2011 | Yoshida |
| 8,076,236 B2 | 12/2011 | Schultz et al. |
| 8,110,854 B2 | 2/2012 | Becker et al. |
| 8,120,939 B2 | 2/2012 | Liaw |
| 8,138,554 B2 | 3/2012 | Chuang et al. |
| 8,324,668 B2 | 12/2012 | Huang et al. |
| 8,338,864 B2 | 12/2012 | Katakura |
| 8,350,339 B2 | 1/2013 | Huang et al. |
| 8,378,419 B2 | 2/2013 | Anderson et al. |
| 8,569,129 B2 | 10/2013 | Ma et al. |
| 8,569,838 B2 | 10/2013 | Blatchford, Jr. et al. |
| 8,581,348 B2 | 11/2013 | Rashed et al. |
| 8,607,172 B2 | 12/2013 | Lu et al. |
| 8,618,607 B1 | 12/2013 | Rashed et al. |
| 8,741,763 B2 | 6/2014 | Ma et al. |
| 8,743,580 B2 | 6/2014 | Liaw |
| 8,760,904 B2 | 6/2014 | Chung |
| 8,775,993 B2 | 7/2014 | Huang et al. |
| 8,809,184 B2 | 8/2014 | Yuan et al. |
| 8,890,288 B2 | 11/2014 | Chen et al. |
| 8,901,627 B2 | 12/2014 | Wu et al. |
| 8,987,128 B2 | 3/2015 | Rashed et al. |
| 9,024,418 B2 | 5/2015 | Zhu et al. |
| 9,070,552 B1 | 6/2015 | Shah et al. |
| 9,099,447 B2 | 8/2015 | Tamaru |
| 9,123,565 B2 | 9/2015 | Lu et al. |
| 9,202,696 B2 | 12/2015 | Yang et al. |
| 9,337,290 B2 | 5/2016 | Lu et al. |
| 9,355,910 B2 | 5/2016 | Rashed et al. |
| 9,520,501 B2 | 12/2016 | Koldiaev et al. |
| 9,563,733 B2 | 2/2017 | Becker |
| 9,564,211 B2 | 2/2017 | Liaw et al. |
| 9,620,510 B2 | 4/2017 | Liaw et al. |
| 9,627,036 B2 | 4/2017 | Yin et al. |
| 2006/0040460 A1 | 2/2006 | Kakimura et al. |
| 2008/0170426 A1 | 7/2008 | Liaw |
| 2009/0014796 A1 | 1/2009 | Liaw |
| 2009/0321791 A1 | 12/2009 | Wagner |
| 2010/0059825 A1 | 3/2010 | Yeric et al. |
| 2010/0117120 A1 | 5/2010 | Yamashita |
| 2010/0123253 A1 | 5/2010 | Ooka |
| 2010/0127333 A1 | 5/2010 | Hou et al. |
| 2011/0147765 A1 | 6/2011 | Huang et al. |
| 2011/0156205 A1* | 6/2011 | Maki ................ H01L 23/5223 257/531 |
| 2011/0241126 A1 | 10/2011 | Herberholz |
| 2012/0074467 A1 | 3/2012 | Abe |
| 2012/0119302 A1 | 5/2012 | Pei et al. |
| 2012/0211837 A1 | 8/2012 | Baars et al. |
| 2013/0020707 A1 | 1/2013 | Or-Bach et al. |
| 2013/0069170 A1 | 3/2013 | Blatchford |
| 2013/0093022 A1 | 4/2013 | Choi |
| 2013/0126978 A1 | 5/2013 | Becker et al. |
| 2013/0146986 A1 | 6/2013 | Rashed et al. |
| 2013/0170275 A1 | 7/2013 | Kumar et al. |
| 2013/0193489 A1 | 8/2013 | Baars et al. |
| 2013/0193516 A1 | 8/2013 | Goldbach et al. |
| 2013/0207199 A1 | 8/2013 | Becker et al. |
| 2013/0242633 A1 | 9/2013 | Liaw |
| 2016/0027499 A1* | 1/2016 | Liaw ................ G11C 11/412 365/154 |
| 2016/0036219 A1 | 2/2016 | Campi, Jr. et al. |
| 2017/0133365 A1 | 5/2017 | Lim et al. |
| 2017/0154848 A1* | 6/2017 | Fan ................ H01L 21/76805 |
| 2017/0186745 A1* | 6/2017 | Pelloie ............ H01L 21/823871 |
| 2017/0244394 A1* | 8/2017 | Kim ................ H03K 3/356156 |

FOREIGN PATENT DOCUMENTS

| | | |
|---|---|---|
| CN | 102142441 A | 8/2011 |
| EP | 0788166 A2 | 8/1997 |
| EP | 1670062 A1 | 6/2006 |
| EP | 2341537 A2 | 7/2011 |
| JP | 2000031298 A | 1/2000 |
| JP | 2001127169 A | 5/2001 |
| JP | 2003243531 A | 8/2003 |
| JP | 2007324409 A | 12/2007 |
| JP | 2008118004 A | 5/2008 |
| JP | 2009267094 A | 11/2009 |
| JP | 2010074125 A | 4/2010 |
| JP | 2010074158 A | 4/2010 |
| JP | 2010118597 A | 5/2010 |
| JP | 2010212531 A | 9/2010 |
| JP | 2011228645 A | 11/2011 |
| JP | 2012074410 A | 4/2012 |
| KR | 20130067214 A | 6/2013 |
| WO | 2014178949 A1 | 11/2014 |

OTHER PUBLICATIONS

Brotman A., et al., "Design Enablement for Yield and Area Optimization at 20 nm and Below", Symposium on VLSI Technology—Digest of Technical Papers, Jun. 2011.

Chang C.Y., et al., "RF CMOS technology for MMIC", Microelectronics Reliability, vol. 42, 2002, pp. 721-733.

Hu C., "Modem Semiconductor Devices for Integrated Circuits", 2009, pp. 195-258.

Intel® Q3GM ES 32 nm CPU (from Core i5 660) Structural Analysis; ChipWorks; ChipWorks Intel i5 Structural Analysis, Nov. 11, 2009.

Kuo J.B., et al.,"CMOS VLSI Engineering Silicon-on-Insulator (SOI)", 1998, pp. 123-131.

Natarajan S., et al., "A 32nm logic technology featuring 2nd-generation high-k + metal-gate transistors, enhanced channel strain and 0.171 µm2 SRAM cell size in a 291Mb array", IEEE International Electron Devices Meeting, 2008.

Nauta B., "A CMOS Transconductance-C Filter Technique for Very High Frequencies", IEEE Journal of Solid-State Circuits, vol. 27, Issue. 2, Feb. 1992, pp. 142-153.

"Process Basis for Silicon Integrated Circuit" (Xudong Guan, Peking University Press, first edition on Oct. 2003, fifth printing on Mar. 2008).

Rashed M., et al., "Innovations in Special Constructs for Standard Cell Libraries in Sub 28nm technologies", IEEE International Electron Devices Meeting, Dec. 2013.

Razavi, Behzad, "Design of Analog CMOS Integrated Circuits," The McGraw-Hill companies, Inc. (2000), pp. 15-22.

U.S. Appl. No. 61/747,751, filed Dec. 31, 2012, titled "Integrated Circuit Layout Design", 29 pages.

Arimoto K., et at., "A 60-ns 3.3-V-only 16-Mbit DRAM with multipurpose register," IEEE Journal of Solid-State Circuits, Oct. 1989, vol. 24 (5), pp. 1184-1190.

(56) References Cited

OTHER PUBLICATIONS

Banerjee K., et al., "3-D ICs: A Novel Chip Design for Improving Deep-Submicrometer Interconnect Performance and Systems-on-Chip Integration," Proceedings of the IEEE, New York, US, vol. 89 (5), May 2001, pp. 602-633, XP011044501, ISSN: 0018-9219.

Parke S., et al., "FlexFET: a low-cost planar, self-aligned independent-double-gate MOSFET with flexible, dynamic threshold control," Fourth Symposium on Information Processing in Sensor Networks, Apr. 15, 2005, pp. 35-37.

Wissel L., et al., "Gate-array library design using local interconnect," Proceedings of Custom Integrated Circuits Conference, IEEE, May 5-8, 1996, pp. 509-512.

* cited by examiner

HIGH PERFORMANCE CELL DESIGN IN A TECHNOLOGY WITH HIGH DENSITY METAL ROUTING

BACKGROUND

Field

Aspects of the present disclosure relate generally to metal routing on a die, and more particularly, to reducing parasitic capacitance caused by high-density metal routing.

Background

A semiconductor die typically includes many cells, where each cell includes two or more transistors that are interconnected to form a circuit (e.g., logic gate). In deep sub-micron technologies, the metal routing density within a cell is high. The high-density metal routing can cause severe parasitic capacitance, which negatively impacts cell performance.

SUMMARY

The following presents a simplified summary of one or more embodiments in order to provide a basic understanding of such embodiments. This summary is not an extensive overview of all contemplated embodiments, and is intended to neither identify key or critical elements of all embodiments nor delineate the scope of any or all embodiments. Its sole purpose is to present some concepts of one or more embodiments in a simplified form as a prelude to the more detailed description that is presented later.

According to a first aspect, a semiconductor die is provided. The semiconductor die includes a first doped region, a second doped region, and an interconnect formed from a first middle of line (MOL) layer, wherein the interconnect electrically couples the first doped region to the second doped region. The semiconductor die also includes a first metal line formed from a first interconnect metal layer, and a first via electrically coupling the interconnect to the first metal line.

According to a second aspect, a semiconductor die is provided. The semiconductor die includes an N-type field effect transistor (NFET) having a drain, a P-type field effect transistor (PFET) having a drain, and an interconnect formed from a first middle of line (MOL) layer, wherein the interconnect electrically couples the drain of the NFET to the drain of the PFET. The semiconductor die also includes a first metal line formed from a first interconnect metal layer, and a first via electrically coupling the interconnect to the first metal line.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

A semiconductor die includes multiple interconnect metal layers in a back end of line (BEOL) of the die, in which adjacent interconnect metal layers are separated by one or more insulating layers. The different interconnect metal layers may include copper and/or other metal materials or compounds, and may be interconnected using vias and/or other structures. The bottom-most interconnect metal layer may be labeled M0 or M1. The description below uses the convention in which the bottom-most interconnect metal layer is labeled M0.

The die also includes transistors formed in a front end of line (FEOL) of the die, which is below the BEOL. The transistors may be fabricated on the substrate of the die using a planar process and/or a non-planar process. The transistors may include planar field effect transistors, FinFETs, and/or other types of transistors. Two or more transistors may be grouped together to form a cell, in which the transistors in the cell are interconnected to form a circuit (e.g., a logic gate, a multiplexer, etc.).

The die also includes contacts in a middle of line (MOL) between the BEOL and the FEOL. The contacts in the MOL are used to electrically couple the transistors to interconnect metal layers in the BEOL, as discussed further below. The contacts may include tungsten and/or other conductive materials or compounds.

In deep sub-micron technologies, interconnect metal layers M0 and M1 are used to form metal lines for metal routing within a cell. In certain aspects, metal layer M0 is used to form unidirectional metal lines that run (extend) in one lateral direction, and metal layer M1 (which lies above metal layer M0) is used to form unidirectional metal lines that run (extend) in a lateral direction that is substantially perpendicular to the lateral direction of the metal lines in metal layer M0. As used herein, the term "lateral" refers to a direction that is horizontal with respect to the substrate of the die. The use of unidirectional metal lines allows advanced processes to achieve higher resolution.

In deep sub-micron technologies, metal routing density is high with pitches between metal lines on the order of a few tens of nanometers in metal layer M0 and metal layer M1. The high-density routing can cause severe parasitic capacitance, which negatively impacts cell performance. An example of this is discussed below with reference to FIG. 1.

Figure 1:
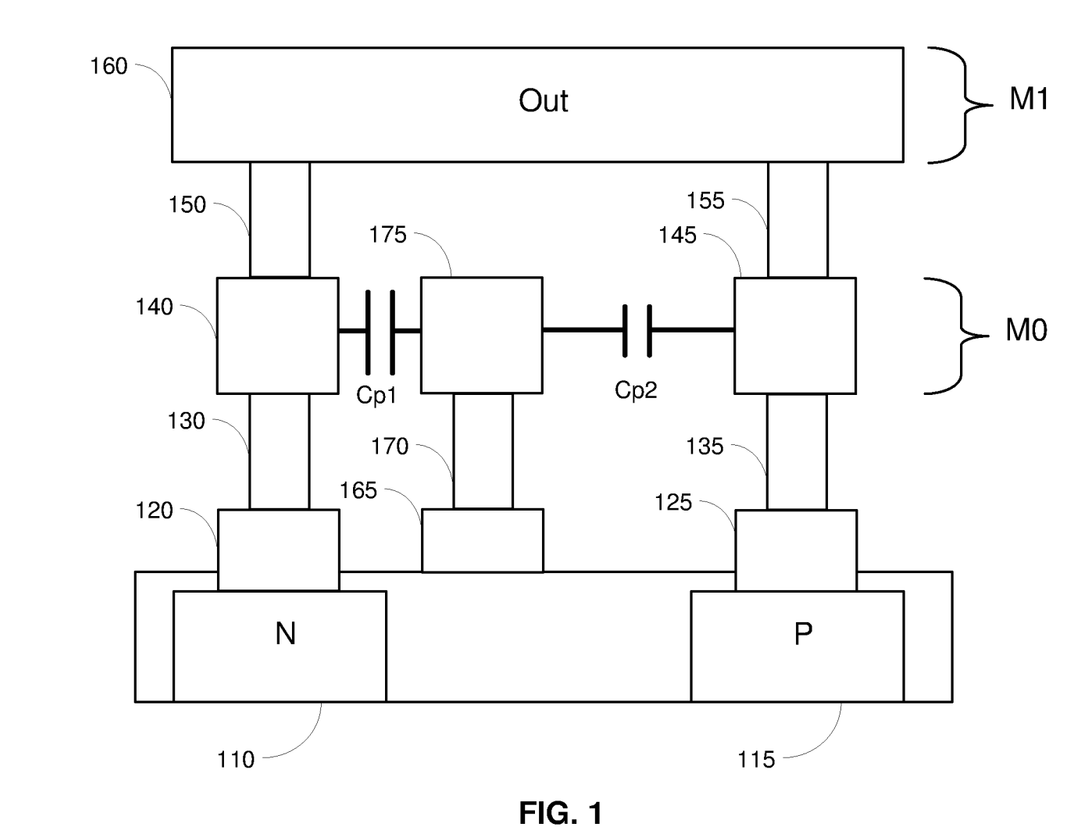
FIG. 1 shows a side view of an example of metal routing within a cell resulting in parasitic capacitance according to certain aspects of the present disclosure.

FIG. 1 shows a side view of a portion of an exemplary cell on a die. In this example, the cell includes an N-type field effect transistor (NFET) and a P-type field effect transistor (PFET) that are interconnected to form an inverter, in which the gates of the NFET and the PFET are coupled together at the input of the inverter, and the drains of the NFET and the PFET are coupled together at the output of the inverter.

As shown in FIG. 1, the cell includes an N-type doped region 110 of the NFET, and a P-type doped region 115 of the PFET. In the discussion below, the N-type doped region 110 is referred to simply as the N region 110, and the P-type doped region 115 is referred to simply as the P region 115.

In this example, the N region 110 acts as a drain of the NFET, and the P region 115 acts as a drain of the PFET. The N and P regions 110 and 115 may be doped using diffusion, implantation, plasma doping, in situ doping, and/or other another doping technique.

The cell includes a contact 120 formed over the N region 110 of the NFET, and a contact 125 formed over the P region 115 of the PFET. The contacts 120 and 125 are formed from a first MOL contact layer (e.g., using photolithographic and etching processes). The first MOL contact layer may also be referred to as an MD layer, a CA layer, or another term. The contacts 120 and 125 provide electrical contacts for the N region 110 and the P region 115, respectively.

The contacts 120 and 125 are electrically coupled to an output metal line 160 formed from metal layer M1 (e.g., using photolithographic and etching processes). More particularly, the contact 120 of the N region 110 is electrically coupled to the output metal line 160 by a structure that includes via 130, a first metal line 140 formed from metal layer M0 (e.g., using photolithographic and etching processes), and via 150. Via 130 couples the contact 120 to the first metal line 140, and via 150 couples the first metal line 140 to the output metal line 160. The contact 125 of the P region 115 is electrically coupled to the output metal line 160 by a structure that includes via 135, a second metal line 145 formed from metal layer M0 (e.g., using photolithographic and etching processes), and via 155. Via 135 couples the contact 125 to the second metal line 145, and via 155 couples the second metal line 145 to the output metal line 160.

Thus, the N region 110 and the P region 115 are coupled together at the output metal line 160 in metal layer M1. Since the N region 110 acts as the drain of the NFET and the P region 115 acts as the drain of the PFET in this example, the drains of the NFET and PFET are coupled together at the output line 160, which provides the output of the inverter formed by the NFET and the PFET.

Figure 2A:
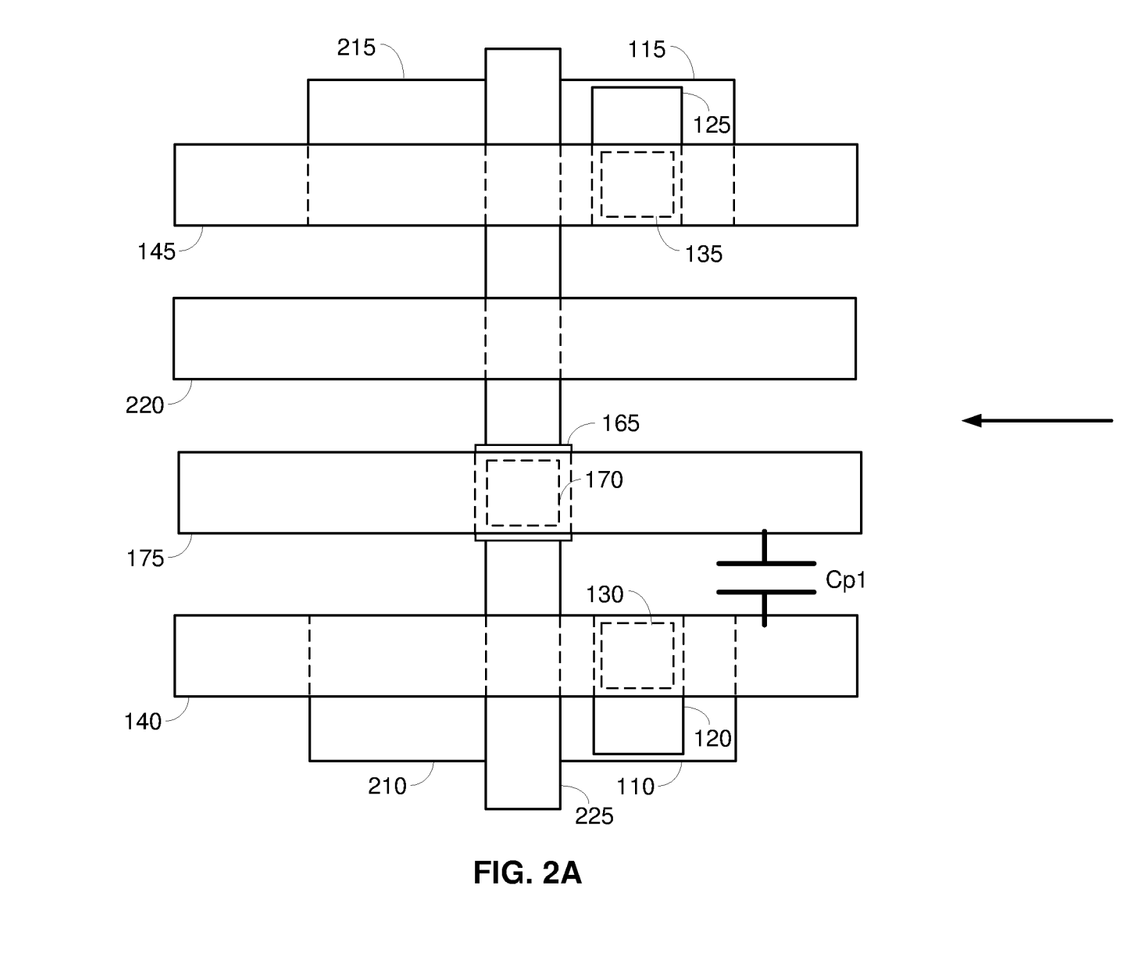
FIG. 2A shows a top view of a portion of the metal routing within the cell according to certain aspects of the present disclosure.

The cell also includes a gate contact 165, a third metal line 175 formed from metal layer M0, and via 170 coupling the gate contact 165 to the third metal line 175. The third metal line 175 is coupled to an input metal line (not shown in FIG. 1) formed from metal layer M1 by a via (not shown in FIG. 1). The gate contact 165 may be formed from a second MOL contact layer over a gate (e.g., using photolithographic and etching processes). An example of the gate is shown in FIG. 2A, as discussed further below. The second MOL contact layer may also be referred to as an MP layer, a CB layer, or another term.

As discussed above, the space between metal lines in metal layer M0 is small for deep sub-micron technologies (e.g., on the order of a few tens of nanometers). As a result, the output metal routing of the cell is in close proximity to the input metal routing of the cell at metal layer M0. The close proximity of the output metal routing and the input metal routing at metal layer M0 results in large parasitic capacitance between the metal routings. In FIG. 1, the parasitic capacitance between the first metal line 140 and the third metal line 175 in metal layer M0 is labeled Cp1, and the parasitic capacitance between the second metal line 145 and the third metal line 175 in metal layer M0 is labeled Cp2. The large parasitic capacitance can severely degrade the performance of the cell.

FIG. 2A shows a top view of the metal routing within the cell up to metal layer M0. More particularly, FIG. 2A shows a top view of the N and P regions 110 and 115, the contacts 120, 125 and 165, the vias 130, 135 and 170, and the first, second and third metal lines 140, 145 and 175. In this example, the cell also includes a fourth metal line 220 formed from metal layer M0, which is not shown in FIG. 1. Note that structures underneath the first, second and third metal lines 140, 145 and 175 are shown with dashed lines. As shown in FIG. 2A, the cell also includes a gate 225 that extends in a lateral direction. The gate 225 is common to the PFET and NFET, in which a portion of the gate 225 lies within the PFET and another portion of the gate 225 lies within the NFET. The cell also includes a P doped region 215 that acts as a source of the PFET, and is located on an opposite side of the gate 225 as the P doped region 115. The source of the PFET may be coupled to a voltage supply rail of the die through a vertical interconnect structure (not shown). The cell also includes an N doped region 210 that acts as a source of the NFET and is on an opposite side of the gate 225 as the N doped region 110. The source of the NFET may be coupled to a ground rail of the die through a vertical interconnect structure (not shown).

As shown in FIG. 2A, the first metal line 140 in the output metal routing and the third metal line 175 in the input metal routing run parallel to each other in the horizontal direction, which substantially increases the parasitic capacitance Cp1 between the first metal line 140 and the third metal line 175.

Figure 2B:
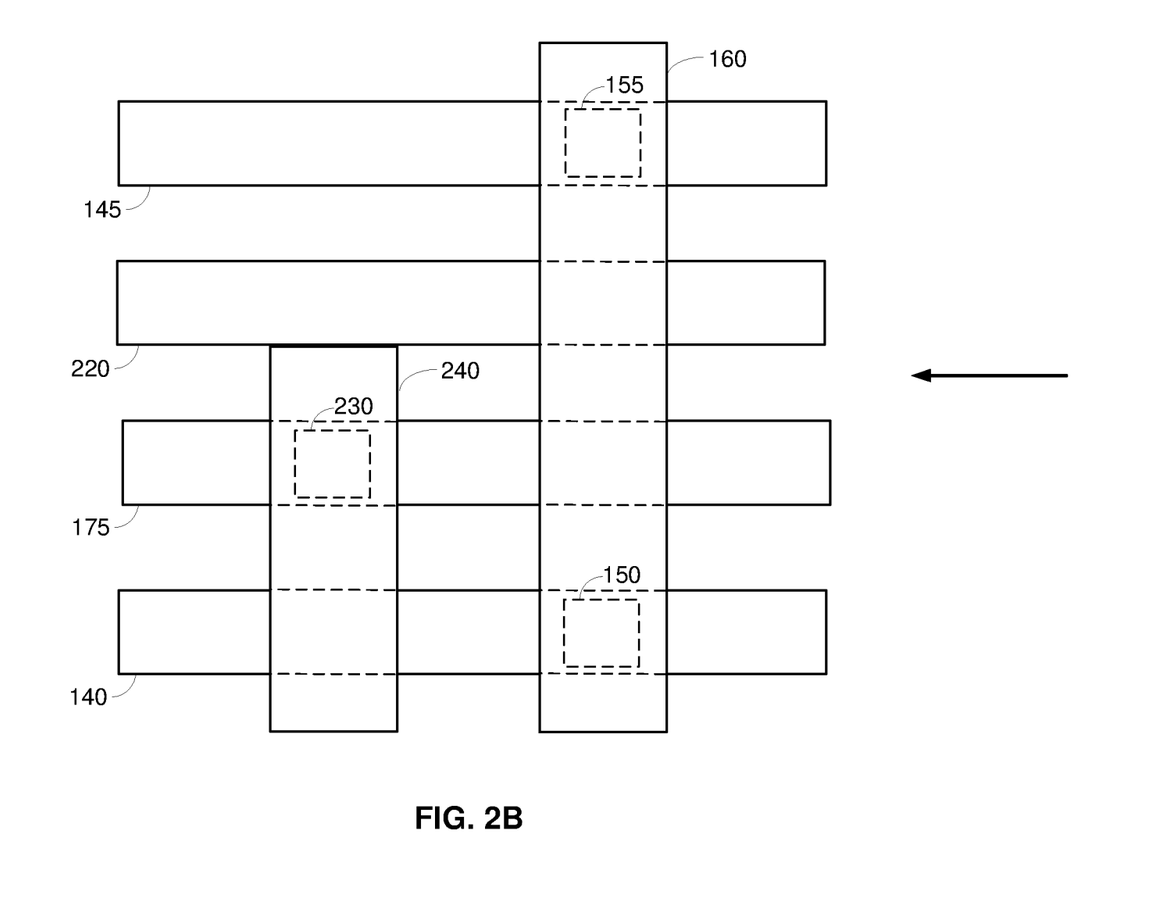
FIG. 2B shows a top view of another portion of the metal routing within the cell according to certain aspects of the present disclosure.

FIG. 2B shows a top view of the metal routing within the cell from metal layer M0 to metal layer M1. More particularly, FIG. 2B shows a top view of the first, second, third and fourth metal lines 140, 145, 175 and 220, the vias 150 and 155, and the output line 160. FIG. 2B also shows the input line 240 (which is in metal layer M1) and the via 230 coupling the third metal line 175 to the input line 240. Note that structures underneath the output line 160 and the input line 240 are shown with dashed lines.

The large arrows in FIGS. 2A and 2B indicate the direction in which the cell is viewed in the side view of the cell shown in FIG. 1.

Thus, the high-density metal routing in the cell discussed above results in large parasitic capacitance between the input and output metal routings at metal layer M0. Accordingly, there is a need to reduce the high parasitic capacitance due to high-density metal routing to improve cell performance.

Embodiments of the present disclosure reduce the parasitic capacitance discussed above by moving a portion of the output metal routing down to the MOL where parasitic capacitance is less dominant, as discussed further below.

Figure 3:
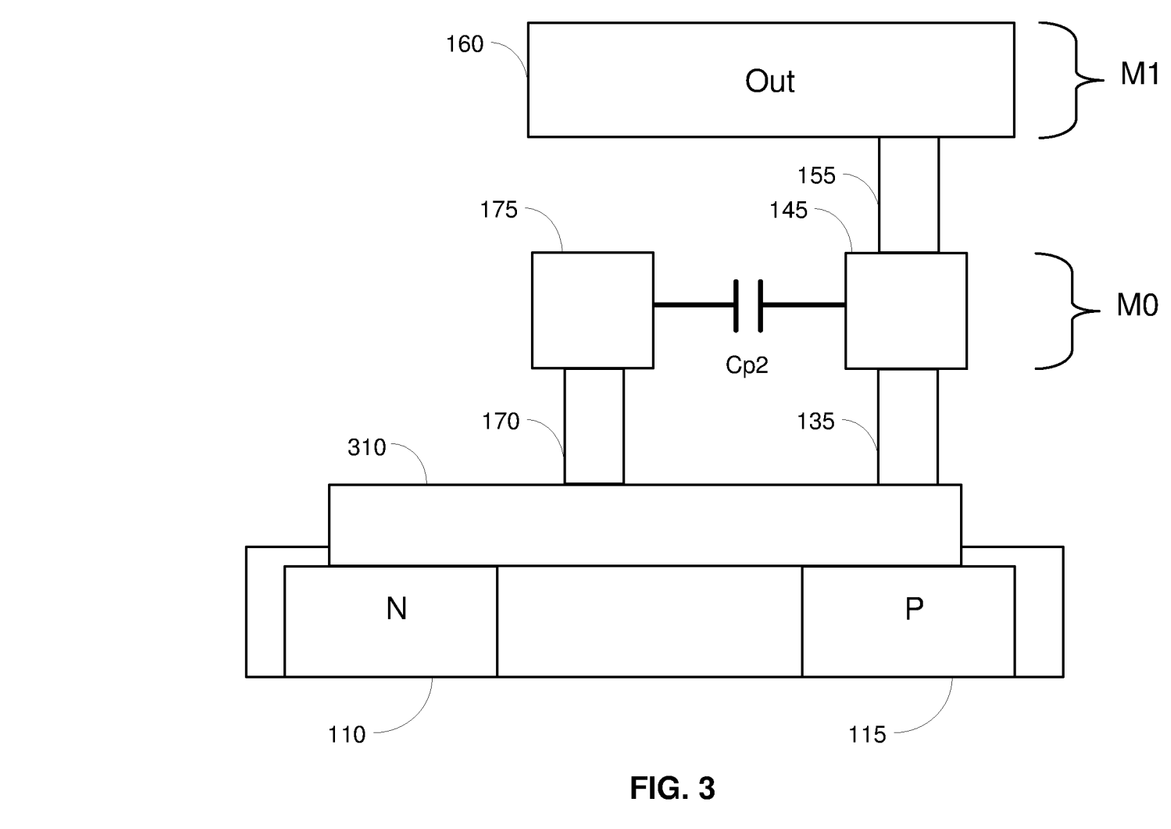
FIG. 3 shows a side view of an example of metal routing within a cell with reduced parasitic capacitance according to certain aspects of the present disclosure.

FIG. 3 shows a side view of a cell with reduced parasitic capacitance according to aspects of the present disclosure. The cell includes the NFET and the PFET discussed above with reference to FIG. 1.

Instead of routing the N region 110 to the output line 160 through the first metal line 140, the cell in FIG. 3 includes an interconnect 310 formed in the MOL which electrically couples the N region 110 of the NFET to the P region 115 of the PFET. In other words, the interconnect 310 provides an electrical connection (metal routing) between the N region 110 and the P region 115 in the MOL. Since the interconnect 310 couples the N region 110 to the P region 115 in the MOL, the N region 110 does not need to be electrically coupled to the output line 160 through the first metal line 140 shown in FIG. 1. Thus, the first metal line 140 is no longer part of the output metal routing. This substantially removes the parasitic capacitance Cp1 between the input metal routing and the output metal routing discussed above.

As a result, the parasitic capacitance between the output metal routing and the input metal routing at metal layer M0 is reduced (e.g., by 30%), thereby improving the performance of the cell (e.g., by 5%). In this example, parasitic capacitance Cp1 shown in FIG. 1 is substantially removed by coupling the N region and P region in the MOL using the interconnect 310. The interconnect 310 may be formed from the first MOL contact layer discussed above, which is the same MOL contact layer used to form the contacts 120 and 125.

Thus, aspects of the present disclosure provide metal routing between an N region of an NFET and a P region of a PFET in the MOL to reduce the parasitic capacitance at metal layer M0.

Figure 4A:
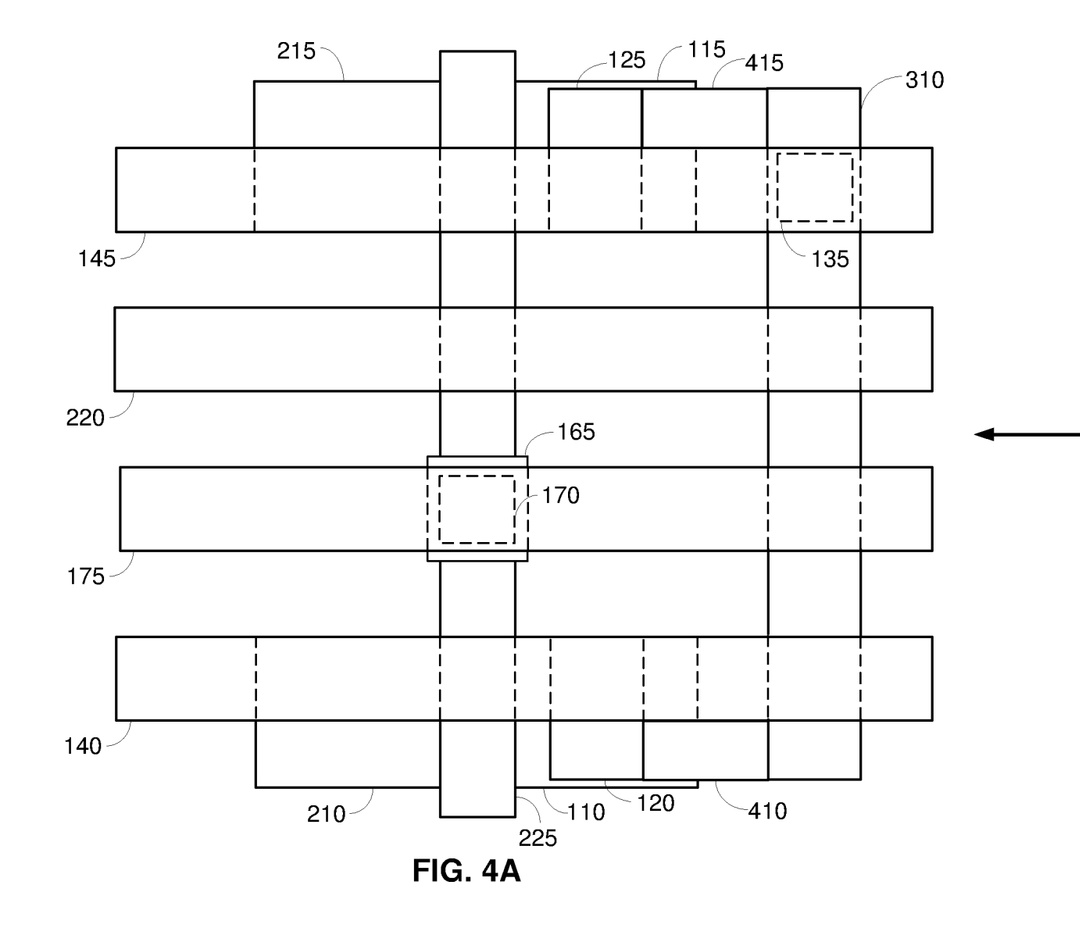
FIG. 4A shows a top view of a portion of the metal routing in FIG. 3 according to certain aspects of the present disclosure.

FIG. 4A shows a top view of the metal routing within the cell up to metal layer M0 according to certain aspects of the present disclosure. More particularly, FIG. 4A shows a top view of the N regions 110 and 210, the P regions 115 and 215, the gate 225, the contacts 120, 125 and 165, the vias 135 and 170, and the metal lines 140, 145, 175 and 220 in metal layer M0. Note that structures underneath the metal lines 140, 145, 175 and 220 are shown with dashed lines.

FIG. 4A also shows the interconnect 310 which extends in a direction substantially perpendicular to the direction of the metal lines 140, 145, 175 and 220. In this example, the length of the interconnect 310 spans the distance between the contact 120 of the N region 110 and the contact 125 of the P region 115. Also, in this example, the interconnect 310 is spaced apart from the contacts 120 and 125 in the horizontal direction (i.e., same lateral direction as the metal lines in metal layer M0). This may be done, for example, due to layout restrictions that prevent placing the interconnect 310 directly between the contacts 120 and 125. In certain aspects, the contacts 120 and 125 and the interconnect 310 are coplanar.

As shown in FIG. 4A, the cell also includes a first bridge 410 and a second bridge 415. The first bridge 410 is disposed between the contact 120 of the N region 110 and the interconnect 310, and electrically couples the contact 120 to the interconnect 310. In one example, the first bridge 410 may be formed from the second MOL contact layer discussed above. In this example, the second MOL contact layer may be coplanar with the first MOL contact layer used to form the contact 120. It is to be appreciated that the present disclosure is not limited to this example, and that the first bridge 410 may be formed using another MOL layer.

A first end of the first bridge 410 contacts the contact 120 and a second end of the bridge 410 contacts the interconnect 310. For example, the first end of the first bridge 410 may contact a sidewall of the contact 120, and the second end of the first bridge 410 may contact a sidewall of the interconnect 310.

The second bridge 415 is disposed between the contact 125 of the P region 115 and the interconnect 310, and electrically couples the contact 125 to the interconnect 310. The second bridge 415 may be formed in the second MOL contact layer discussed above or another MOL layer.

A first end of the first bridge 415 contacts the contact 125 and a second end of the bridge 410 contacts the interconnect 310. For example, the first end of the second bridge 415 may contact a sidewall of the contact 125, and the second end of the second bridge 415 may contact a sidewall of the interconnect 310.

Thus, in this example, the contact 120 of the N region 110 is electrically coupled to the contact 125 of the P region 115 in the MOL through the interconnect 310 and the first and second bridges 410 and 415.

As shown in FIG. 4A, the cell also includes via 135, which electrically couples the interconnect 310 to the second metal line 145 in metal layer M0. The via 130 used to couple the contact 120 of the N region 110 to the first metal line 140 in FIG. 2A is not present in this example. This is because the contact 120 of the N region 110 is now electrically coupled to the output line 160 through the interconnect 310 in the MOL. Thus, the first metal line 140 is no longer part of the output metal routing of the cell. This substantially removes the parasitic capacitance Cp1 between the input metal routing and the output metal routing discussed above. The first metal line 140 is not shown in FIG. 3 because it is no longer part of the output metal routing.

Figure 4B:
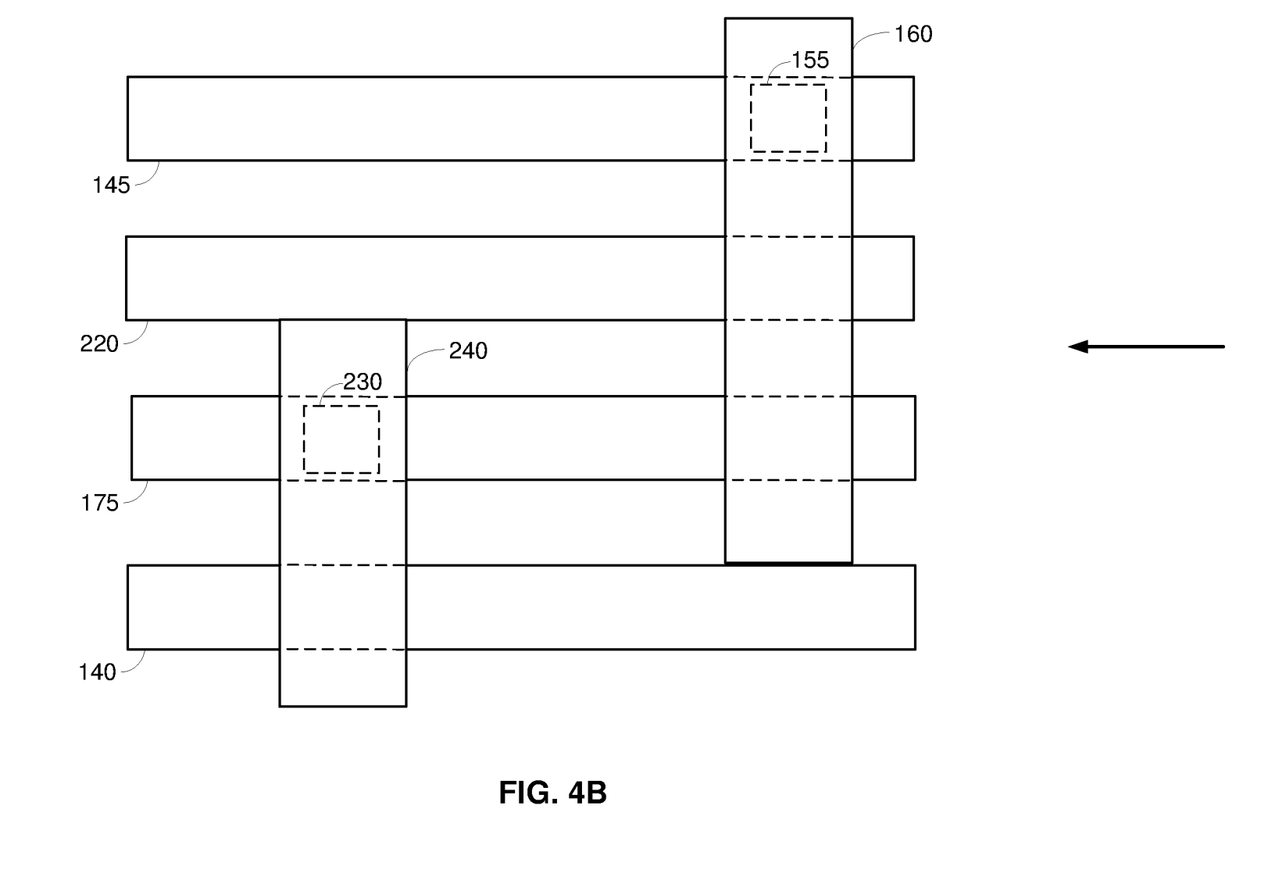
FIG. 4B shows a top view of another portion of the metal routing in FIG. 3 according to certain aspects of the present disclosure.

FIG. 4B shows a top view of the metal routing from metal layer M0 to metal layer M1 according to certain aspects of the present disclosure. More particularly, FIG. 4B shows a top view of the first, second, third and fourth metal lines 140, 145, 175 and 220, vias 230 and 155, the output line 160, and the input line 240. In this example, the via 150 used to couple the first metal line 140 to the output line 160 in FIG. 2B is not present. This is because the first metal line 140 is no longer part of the output metal routing, as discussed above. Also, in this example, the output metal line 160 does not extend over the first metal line 140.

Figure 5A:
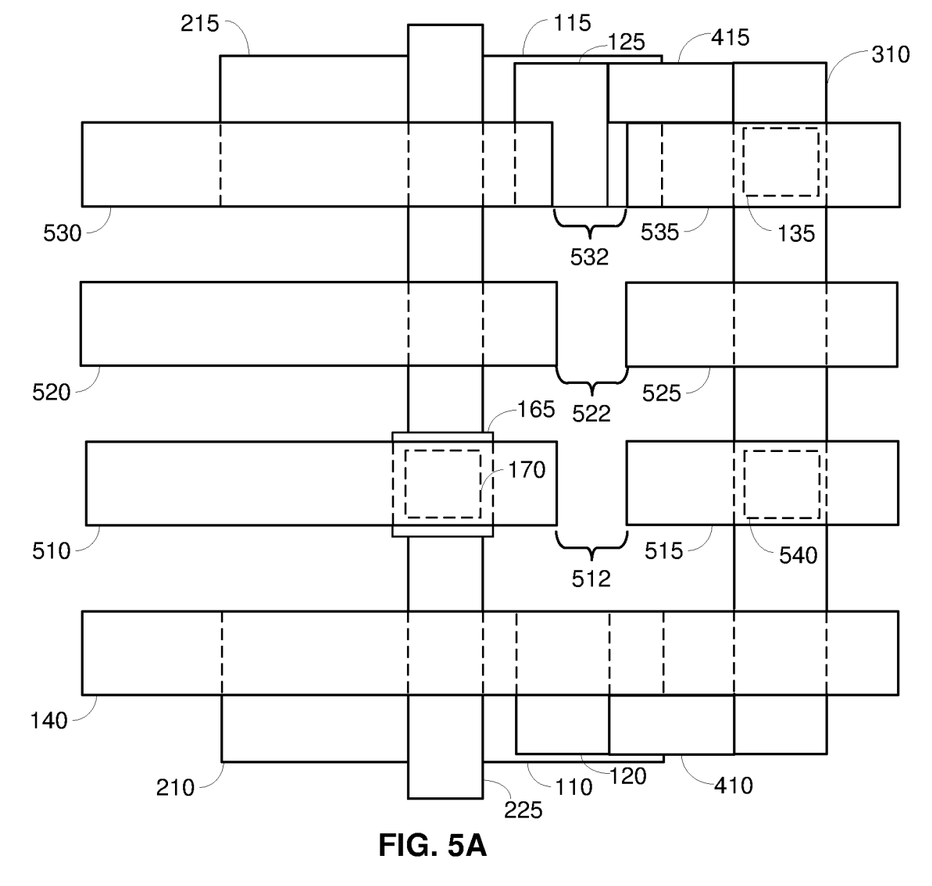
FIG. 5A shows a top view of a portion of a second example of metal routing with reduced parasitic capacitance according to certain aspects of the present disclosure.

FIG. 5A shows a top view of metal routing within the cell up to metal layer M0 according to other aspects of the present disclosure. Similar to the cell shown in FIG. 4A, the cell in FIG. 5A includes the N regions 110 and 210, the P regions 115 and 215, the gate 225, the contacts 120, 125 and 165, the vias 135 and 170, the first and second bridges 410 and 415, and the interconnect 310. As discussed above, the interconnect 310 electrically couples the N and P regions 110 and 115 in the MOL.

In the example shown in FIG. 5A, the metal lines 145, 175 and 220 shown in FIG. 4A are cut in the vertical direction. More particularly, metal line 175 shown in FIG. 4A is cut to form metal lines 510 and 515. Metal lines 510 and 515 extend laterally along a common line since they are formed by cutting metal line 175, and are spaced apart by a gap 512. Metal line 220 shown in FIG. 4A is cut to form metal lines 520 and 525. Metal lines 520 and 525 extend laterally along a common line and are spaced apart by a gap 522. Lastly, metal line 145 shown in FIG. 4A is cut to form metal lines 530 and 535. Metal lines 530 and 535 extend laterally along a common line and are spaced apart by a gap 532. In this example, the metal lines 145, 175 and 220 may be cut, for example, using a cut mask in a photolithographic process.

As shown in FIG. 5A, via 135 electrically couples the interconnect 310 to metal line 535 (which is formed by cutting metal line 145). In this example, the cell also includes via 540, which electrically couples the interconnect 310 to metal line 515. As discussed further below, the output metal routing in this example also includes metal line 515. Via 170 electrically couples the gate contact 165 to metal line 510, which is part of the input metal routing. Although there is some parasitic capacitance between metal lines 510 and 515, the parasitic capacitance is much less than parasitic capacitance Cp1 discussed above. This is because one end of metal line 510 is adjacent to one end of metal line 515, which results in relatively small capacitance. In contrast, metal line 140 and metal line 175 in FIG. 2A run parallel to each other in the horizontal direction, which substantially increases parasitic capacitance Cp1.

Figure 5B:
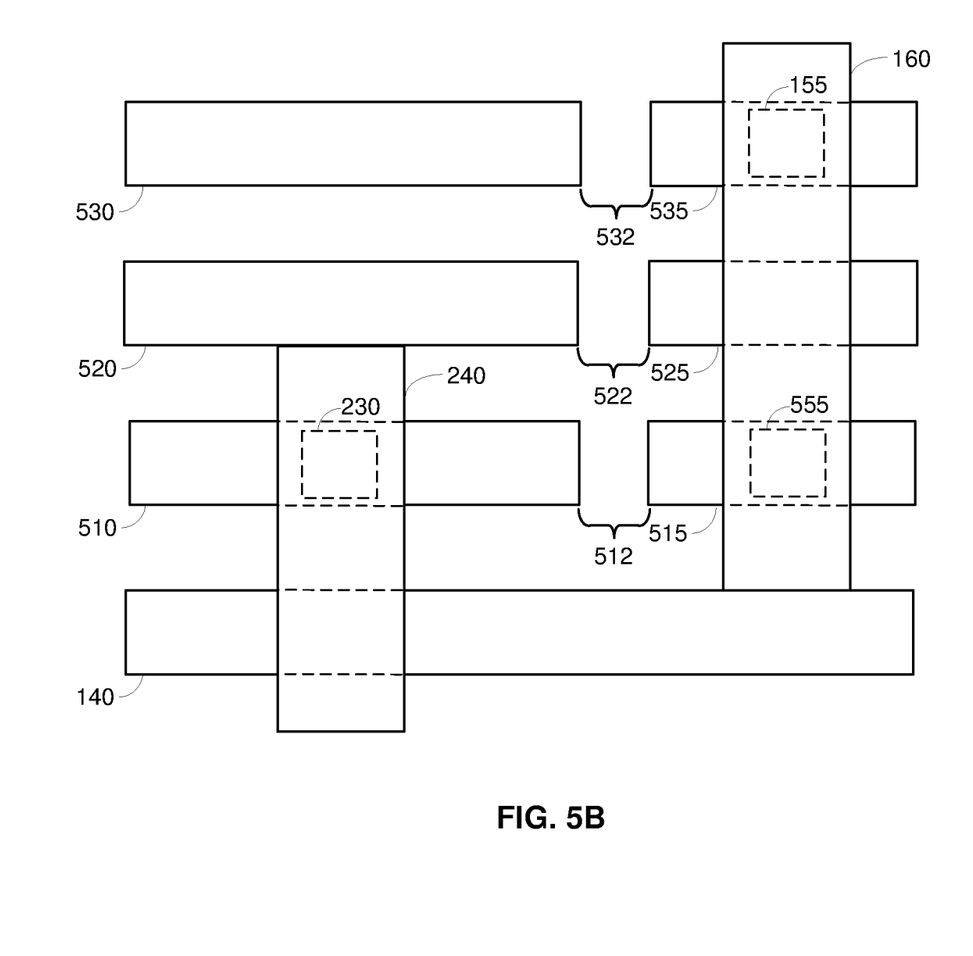
FIG. 5B shows a top view of another portion of the second example of metal routing according to certain aspects of the present disclosure.

FIG. 5B shows a top view of the metal routing within the cell from metal layer M0 to metal layer M1 according to certain aspects of the present disclosure. More particularly, FIG. 5B shows a top view of the metals lines 140, 510, 515, 520, 525, 530 and 535 in metal layer M0. FIG. 5B also shows a top view of the output line 160, and the input line 240, both of which are in metal layer M1.

As shown in FIG. 5B, via 155 couples metal line 535 to the output line 160, and via 230 couples metal line 510 to the input line 240. In this example, the cell also includes via 555, which couples metal line 515 to the output line 160. This, in this example, the output metal routing includes two structures coupling the interconnect 310 to the output line 160. The first structure includes via 135 (shown in FIG. 5A), metal line 535 and via 155, and the second structure includes via 540 (shown in FIG. 5A), metal line 515 and via 555.

Figure 6A:
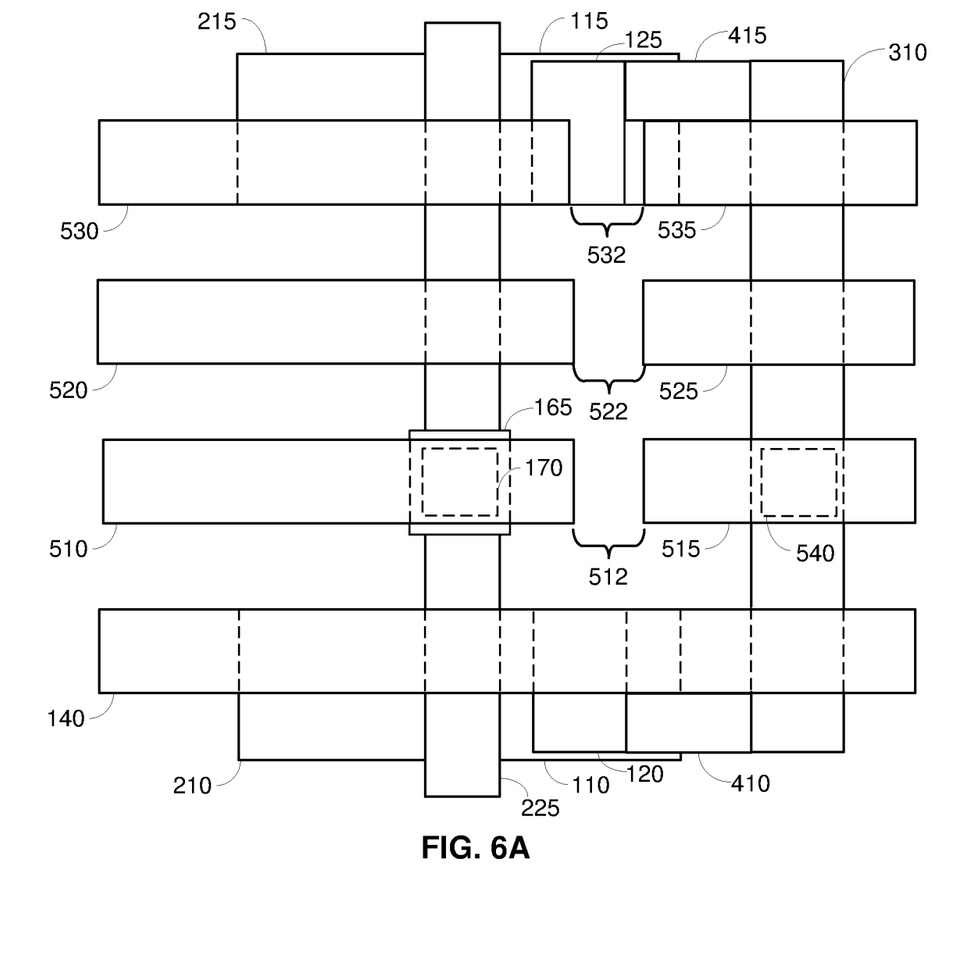
FIG. 6A shows a top view of a portion of a third example of metal routing with reduced parasitic capacitance according to certain aspects of the present disclosure.
Figure 6B:
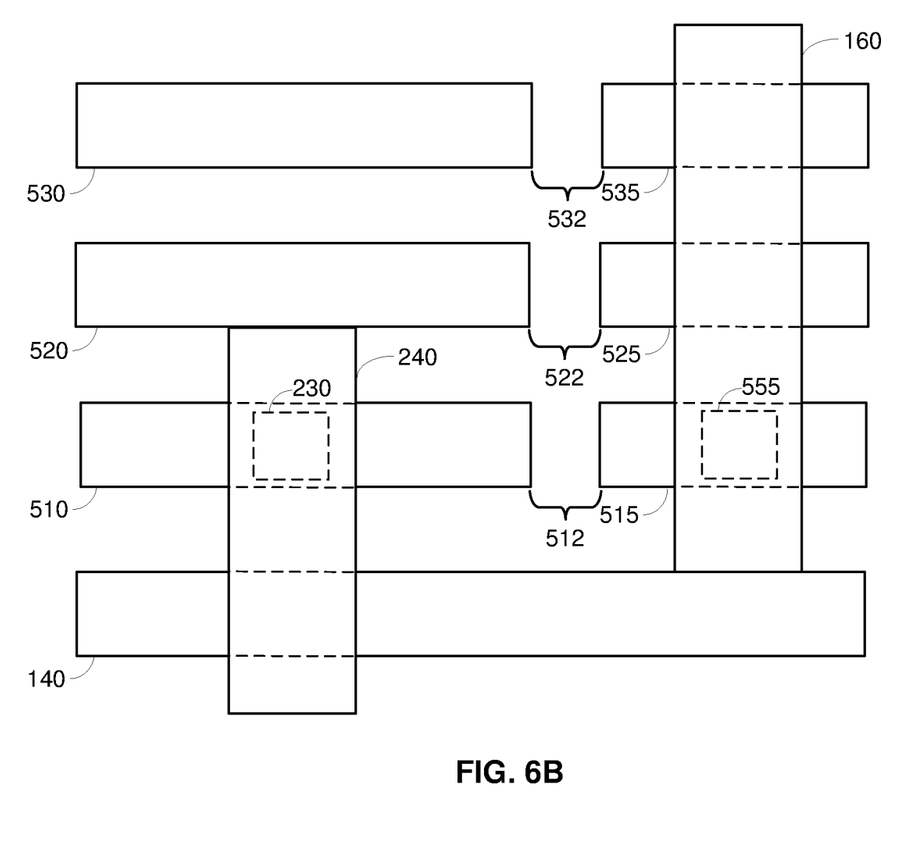
FIG. 6B shows a top view of another portion of the third example of metal routing according to certain aspects of the present disclosure.

In certain aspects, the first structure coupling the interconnect 310 to the output metal line 160 may be omitted. In this regard, FIGS. 6A and 6B show the cell in FIGS. 5A and 5B in which the first structure coupling the interconnect 310 to the output metal line 160 is omitted. More particularly, the via 135 coupling the interconnect 310 to metal line 535 is omitted and the via 155 coupling metal line 535 to the output line 160 is omitted. Thus, in this example, the interconnect 310 is coupled to the output line 160 through via 540, metal line 515 and via 555.

Although aspects of the present disclosure are described above using the convention in which the bottom-most interconnect metal layer in the BEOL is labeled M0, it is to be appreciated that the present disclosure is not limited to this convention. For example, the present disclosure also covers the convention in which the bottom-most metal layer in the BEOL is labeled M1. In this example, the M0 and M1 metal layers discussed above are labeled M1 and M2, respectively. Also, it is to be appreciated that the present disclosure is not limited to the terminology used above to describe aspects of the present disclosure. For example, the middle of line (MOL) may also be referred to as the middle end of line (MEOL) or another terminology.

Although aspects of the present disclosure are described above using the example in which region 110 is N-type doped and region 115 is P-type doped, it is to be appreciated that the present disclosure is not limited to this example. For example, region 110 may be P-type doped and region 115 may be N-type doped, both regions 110 and 115 may be N-type doped, or both regions 110 and 115 may be P-type doped.

It is to be appreciated that the exemplary structures discussed above are subject to a small degree of process variation on a physical chip, which is unavoidable in semiconductor fabrication processes. Therefore, the exemplary structures described above are intended to cover structures on a physical chip that vary slightly from the exemplary structures due to the process variation of the fabrication process used to fabricate the chip.

Within the present disclosure, the term "coplanar" does not require that two layers have the same thickness to be coplanar. Rather, the term "coplanar" is intended to cover two layers that are intersected by a common plan that is horizontal with respect the substrate of the die.

Within the present disclosure, the word "exemplary" is used to mean "serving as an example, instance, or illustration." Any implementation or aspect described herein as "exemplary" is not necessarily to be construed as preferred or advantageous over other aspects of the disclosure. Likewise, the term "aspects" does not require that all aspects of the disclosure include the discussed feature, advantage or mode of operation. The term "electrically coupled" is used herein to refer to the direct or indirect electrical coupling between two structures.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed is:

1. A semiconductor die, comprising:
a first doped region;
a second doped region;
a first contact over the first doped region;
a second contact over the second doped region, wherein the first contact and the second contact are in a first contact middle of line (MOL) layer of the semiconductor die;
an interconnect formed from the first contact MOL layer, wherein the interconnect is spaced apart from the first contact and the second contact in a first lateral direction, and the interconnect extends in a second lateral direction that is perpendicular to the first lateral direction;
a first bridge between the first contact and the interconnect, wherein the first bridge electrically couples the first contact to the interconnect;
a second bridge between the second contact and the interconnect, wherein the second bridge electrically couples the second contact to the interconnect;
a first metal line formed from a first interconnect metal layer; and
a first via electrically coupling the interconnect to the first metal line,
wherein the first and second contacts are formed from the first contact MOL layer, and the first and second bridges are formed from a second MOL layer.

2. The semiconductor die of claim 1, wherein the first doped region comprises an N-type doped region, and the second doped region comprises a P-type doped region.

3. A semiconductor die, comprising:
a first doped region;
a second doped region;
a first contact over the first doped region;

a second contact over the second doped region, wherein the first contact and the second contact are in a first contact middle of line (MOL) layer of the semiconductor die;
an interconnect formed from the first contact MOL layer, wherein the interconnect is spaced apart from the first contact and the second contact in a first lateral direction, and the interconnect extends in a second lateral direction that is perpendicular to the first lateral direction;
a first bridge between the first contact and the interconnect, wherein the first bridge electrically couples the first contact to the interconnect;
a second bridge between the second contact and the interconnect, wherein the second bridge electrically couples the second contact to the interconnect;
a first metal line formed from a first interconnect metal layer;
a first via electrically coupling the interconnect to the first metal line;
a gate;
a gate contact over the gate;
a second metal line formed from the first interconnect metal layer; and
a second via electrically coupling the gate contact to the second metal line, wherein the first metal line and the second metal line extend along a common line, and the first metal line and the second metal line are spaced apart by a gap.

4. The semiconductor die of claim 3, wherein the first metal line and the second metal line extend in a same lateral direction.

5. A semiconductor die, comprising:
a first doped region;
a second doped region;
a first contact over the first doped region;
a second contact over the second doped region, wherein the first contact and the second contact are in a first contact middle of line (MOL) layer of the semiconductor die;
an interconnect formed from the first contact MOL layer, wherein the interconnect is spaced apart from the first contact and the second contact in a first lateral direction, and the interconnect extends in a second lateral direction that is perpendicular to the first lateral direction;
a first bridge between the first contact and the interconnect, wherein the first bridge electrically couples the first contact to the interconnect;
a second bridge between the second contact and the interconnect, wherein the second bridge electrically couples the second contact to the interconnect;
a first metal line formed from a first interconnect metal layer;
a first via electrically coupling the interconnect to the first metal line;
a gate;
a gate contact over the gate;
a second metal line formed from the first interconnect metal layer;
a second via electrically coupling the gate contact to the second metal line;

an input metal line formed from a second interconnect metal layer;
a third via electrically coupling the second metal line to the input metal line;
an output metal line formed from the second interconnect metal layer; and
a fourth via electrically coupling the first metal line to the output metal line.

6. The semiconductor die of claim 5, wherein the first doped region comprises an N-type doped region of an NFET, and the second doped region comprises a P-type doped region of a PFET.

7. The semiconductor die of claim 5, wherein the first metal line and the second metal line extend in the first lateral direction, and the input metal line and the output metal line extend in the second lateral direction.

8. The semiconductor die of claim 1, further comprising:
a second metal line formed from the first interconnect metal layer; and
a second via electrically coupling the interconnect to the second metal line.

9. The semiconductor die of claim 8, further comprising:
an output metal line formed from a second interconnect metal layer;
a third via electrically coupling the first metal line to the output metal line; and
a fourth via electrically coupling the second metal line to the output metal line.

10. The semiconductor die of claim 9, wherein the first metal line and the second metal line extend in the first lateral direction, and the output metal line extends in the second lateral direction.

11. A semiconductor die, comprising:
an N-type field effect transistor (NFET) having a drain;
a P-type field effect transistor (PFET) having a drain, wherein the NFET and the PFET have a common gate, and the NFET and the PFET are interconnected to form an inverter;
an interconnect formed from a first middle of line (MOL) layer, wherein the interconnect electrically couples the drain of the NFET to the drain of the PFET;
a first metal line formed from a first interconnect metal layer;
a first via electrically coupling the interconnect to the first metal line;
a gate contact over the gate, wherein the gate contact is formed from a second MOL layer;
a second metal line formed from the first interconnect metal layer; and
a second via electrically coupling the gate contact to the second metal line;
wherein the first metal line and the second metal line extend along a common line, and the first metal line and the second metal line are spaced apart by a gap.

12. The semiconductor die of claim 1, wherein the first and second bridges extend in the first lateral direction.

13. The semiconductor die of claim 12, wherein the first and second contacts, the first and second bridges, and the interconnect are coplanar.

* * * * *